United States Patent [19]

Minezaki et al.

[11] 4,326,929
[45] Apr. 27, 1982

[54] FORMATION OF AN ELECTRODE PATTERN

[75] Inventors: Shigehiro Minezaki, Ikoma; Toshiaki Takamatsu, Tenri; Shuichi Kozaki, Nara, all of Japan

[73] Assignee: Sharp Kabushiki Kaisha, Osaka, Japan

[21] Appl. No.: 81,439

[22] Filed: Oct. 3, 1979

[30] Foreign Application Priority Data

Oct. 3, 1978 [JP] Japan .................................. 53-122234

[51] Int. Cl.³ .................. C25D 11/02; B05D 5/00; B05D 5/12
[52] U.S. Cl. .................................. 204/15; 204/38 S; 427/108; 427/109; 427/266
[58] Field of Search .................. 204/15, 38 A; 427/99, 427/108, 109, 124, 166, 259, 261, 266, 270, 282

[56] References Cited

U.S. PATENT DOCUMENTS

| | | | |
|---|---|---|---|
| 3,351,825 | 11/1967 | Vidas | 204/15 |
| 3,498,833 | 3/1970 | Lehrer | 427/99 |
| 3,814,501 | 6/1974 | Schindler | 427/108 |
| 3,928,658 | 12/1975 | Van Boxtel | 427/109 |
| 3,991,227 | 11/1976 | Carlson | 427/259 |
| 4,076,575 | 2/1978 | Chang | 427/99 |
| 4,187,340 | 2/1980 | Oishi | 427/259 |

Primary Examiner—T. M. Tufariello
Attorney, Agent, or Firm—Birch, Stewart, Kolasch & Birch

[57] ABSTRACT

A method is disclosed for forming an electrode pattern which is free of erosion, separation of a wiring pattern from a substrate, etc., through the use of a lift-up method, which comprises the steps of: etching a transparent, electrically conductive film deposited on a major surface of the substrate for the formation of the transparent electrode pattern; overlaying the whole of the major surface of the substrate with a layer of photoresist; removing a portion of said photoresist layer in the metal electrode pattern; coating substantially the entire major surface of the substrate with a layer of metal electrode material; and removing the remaining photoresist layer with the aid of a resist remover thereby forming the metal electrode pattern.

10 Claims, 3 Drawing Figures

FORMATION OF AN ELECTRODE PATTERN

BACKGROUND OF THE INVENTION

This invention relates to the formation of an electrode pattern for use in a matrix panel and more particularly a method for depositing a metallic electrode pattern on a transparent, electrically conductive film.

A matrix type display generally comprises a large number of strip electrodes on two opposite substrates wherein intersections of the strip electrodes define respective ones of picture elements and selected ones of the picture electrodes are supplied with a proper voltage for displaying desired symbols, digits, graphs, patterns, etc.

As is well known, problems commonly occur in such conventional matrix type display, for example, a crosstalk phenomenon and a considerable reduction in the contrast of the respective picture elements with an increase in the number of scanning lines in the case of a large sized display panel. Those problems are particularly severe with the liquid crystal display. Even if a voltage averaging method is employed as a display drive method, problems such as a limited range of the viewing angle still remain with twisted nematic field effect mode liquid crystal displays (TN-FEM-LCDs).

An attempt to increase the resolution of matrix type LCDs without a drop of the effective value of applied voltages has been made through improvements in an electrode pattern and a cell structure. The present inventor has proposed and disclosed a two-layer electrode structure for LCDs in copending application Ser. No. 921,062, MATRIX TYPE LIQUID CRYSTAL DISPLAY PANEL, filed on June 30, 1978 (Ref: 1054-GER). However, problems with the manufacture of such electrode structure still remain unsolved, for example, the occurrence of pinholes and separation of part of a wiring pattern from a glass substrate.

OBJECTS OF THE INVENTION

It is therefore an object of the present invention to provide a method of forming an electrode pattern which is free of erosion, separation of a wiring pattern from a substrate etc., through the use of a lift up method.

According to the major features of the present invention, a method is disclosed for forming on a substrate a metal electrode pattern and a transparent electrode pattern both of which at least partially overlap each other, comprises the steps of: etching a transparent, electrically conductive film deposited on a major surface of the substrate for the formation of the transparent electrode pattern; overlaying substantially the entire major surface of the substrate with a layer of photoresist; removing a portion of said photoresist layer in the metal electrode pattern; coating substantially the entire major surface of the substrate with a layer of metal electrode material; and removing the remaining photoresist layer with the aid of a resist remover thereby forming the metal electrode pattern.

BRIEF DESCRIPTION OF THE DRAWINGS

For a more complete understanding of the present invention and for further objects and advantages thereof, reference is now made to the following description take in conjunction with the accompanying drawings, in which.

DETAILED DESCRIPTION OF THE INVENTION

Figure 1:
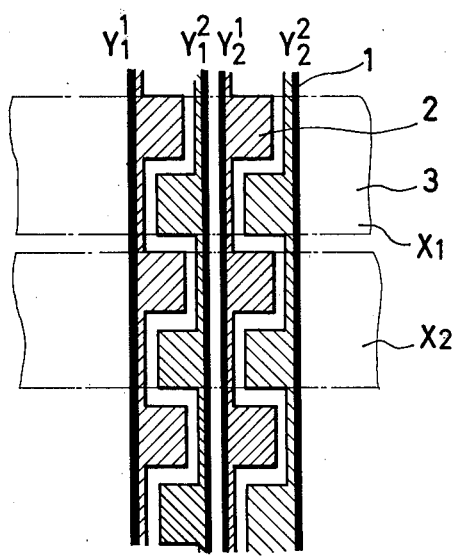
FIG. 1 is a schematic diagram of an electrode structure of a matrix type display panel.

Referring now to FIG. 1, there is illustrated an electrode structure of a liquid crystal display panel comprises not a simple combination of strip electrodes but a plurality of small area regions with one side thereof connected commonly through a line connector column by column. In the example of FIG. 1, a pair of column electrodes connected to each other correspond to the conventional signal column electrode. In other words, there are disposed the line connectors 1 of a relatively low resistance material such as Al, Au, Cr, Ni, Ti, V, Fe and so on square electrodes 2 of a transparent conductive electrode material such as $In_2O_3$ and $SnO_2$. As stated above, one side of each of the square electrodes 2 on the same column is connected commonly by the line connector 1. The square electrodes 2 each comprise alternatively disposed Y axis electrodes $Y_1{}^1$ and $Y_1{}^2$ both of which constitute a single Y axis electrode $Y_1$. An X axis electrode 3, on the other hand, is made of a transparent electrode material such as $In_2O_3$ and shaped as in the conventional strip electrodes $X_1$, $X_2$, . . . .

Figure 2A:
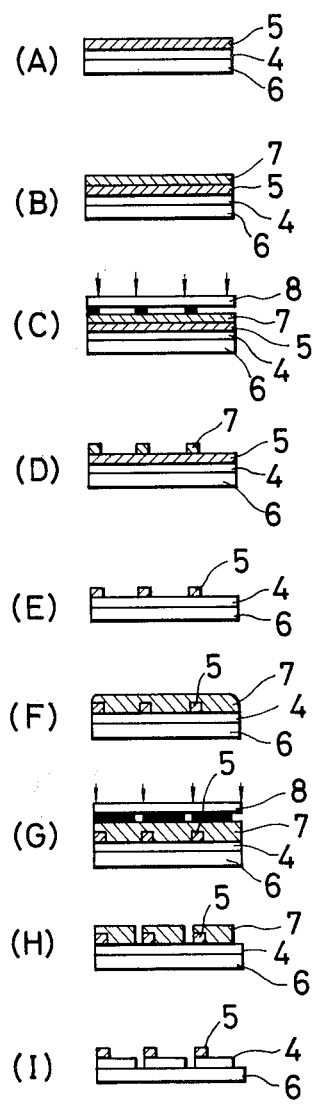
FIGS. 2(a) and 2(b) are flow charts showing conventional ways of forming an electrode pattern.
Figure 2B:
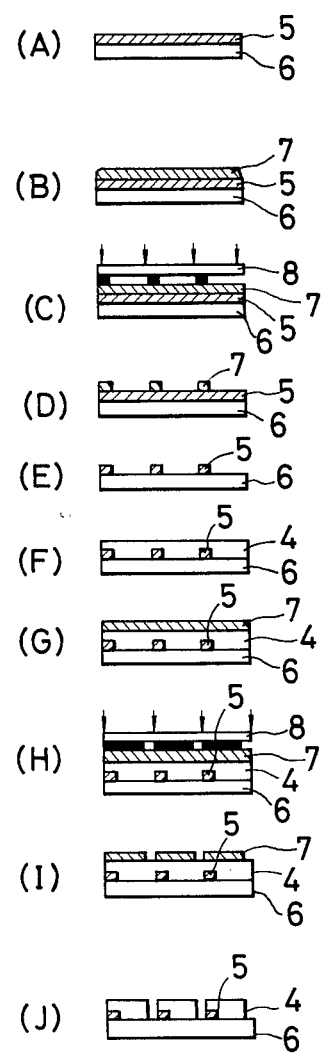

Conventional ways of forming the Y axis electrodes are depicted in FIGS. 2(a) and 2(b) for a better understanding of the present invention.

In FIG. 2(a) a transparent electrode layer 4 of $In_2O_3$, etc. is deposited on a glass substrate 6. A metallic conductor 5 is deposited on the transparent electrode layer 4 (FIG. 2(a)-A). After the deposition of a positive type photoresist film 7 (FIG. 2(a)-B), the unit is exposed to light through a photomask 8 (FIG. 2(a)-C) and developed thereby forming a photoresist pattern (FIG. 2(a)-D). The conductive metal electrode layer 5 is selectively etched while the resulting photoresist pattern is masked, thereby forming a conductive metal electrode pattern (FIG. 2(a)-E). Moreover, a transparent electrode pattern is formed through the formation of a resist layer 7 of the positive type, the deposition of a photomask (FIG. 2(a)-G) and development (FIG. 2(a)-H). While the photoresist layer 7 shows as a mask, the underlying transparent conductive layer 4 is chemically etched to form an electrode pattern (FIG. 2(a)-I).

An alternative way shown in FIG. 2(b) involves the deposition of a conductive metal layer 5 on a glass substrate 6 (FIG. 2(b)-A), the deposition of a positive type photoresist layer 7 (FIG. 2(b)-B), light exposure through a photomask 8 (FIG. 2(b)-C), and the development of a resist pattern (FIG. 2(b)-D). The photoresist is masked and an electrode pattern is formed from the conductive metal film 5 (FIG. 2(b)-E). A transparent conductive film 4 is deposited thereon (FIG. 2(b)-F) and covered with a new layer of the positive resist material (FIG. 2(b)-G). A photomask 8 of a different shape is deposited on the positive type resist layer for light exposure (FIG. 2(b)-H), thus forming a resist pattern (FIG. 2(b)-I). While this resist matter is used as a mask, the transparent conductive layer 4 is etched to thereby form an electrode pattern (FIG. 2(b)-J).

However, the above-described conventional methods suffer serious problems. Using the conventional method of FIG. 2(a), a metal material having a greater ionization tendency than that of hydrogen, for example, aluminum (Al) commonly used as a metallic wiring material, is vacuum deposited on the transparent conductive layer $In_2O_3$. In this instance, when the patterns are formed in sequence as shown in FIG. 2(a) D-E, the underlying $In_2O_3$ layer is reduced by hydrogen developed in an Al etchant, thus generating pin holes. (Al etching conditions, the etchant; $H_3PO_4:HNO_3:CH_3COOH=80:5:15$ and the etching temperature; 55° C.-60° C.). Although being covered with the photoresist layer during the steps of etching the $In_2O_3$ pattern of FIG. 2(a) H-I, the overlying conductive metal layer suffers erosion by the $In_2O_3$ etchant and generates breaks or pinholes ($In_2O_3$ etching conditions, the etchant; $FeCl_3:HCl=2:1$ or 1:1 and the etching temperature; 40° C., $In_2O_3$ pattern forming conditions, the resist used; AZ 1350 of $\simeq 0.6$ μm thick or AZ 1350 J of $\simeq 3-4$ μm thick both available from Shipley Far East Ltd.).

The method of FIG. 2(a) is also disadvantageous in the case where a metal material has a smaller ionization tendency than that of hydrogen, for example, gold (Au) commonly used as a metallic wiring material, is vacuum deposited on the transparent conductive $In_2O_3$ layer. In other words, Au often remains on the underlying $In_2O_3$ layer, leading to leakage current from the $In_2O_3$ electrode after the formation of the $In_2O_3$ pattern and deteriorating display quality. (the Au etching conditions, $NH_4I=4.0$ g, $I_2=1.2$ g, $C_2H_5OH=30$ cc, $H_2O=20$ cc with room temperature). During the steps of forming the $In_2O_3$ pattern (FIG. 2(a) E-I) there are developed eroded patterns on the $In_2O_3$ pattern more than a desired photomask pattern. This is believed to be due to the fact that the resist layer 7 displays a bad adherence with the transparent $In_2O_3$ layer 4 and the $In_2O_3$ layer is over etched.

The method of FIG. 2(b) is also disadvantageous as follows: When a metal material such as Al, Ni, Cu, Cr and Co is vacuum deposited and patterned on the glass substrate (FIG. 2(b) I-J), the underlying conductive metal material is eroded with an $In_2O_3$ etchant though being covered with the photoresist layer and the $In_2O_3$ layer, resulting in the occurrence of breaks and pinholes and declined display quality. ($In_2O_3$ etching conditions, the etchant; $FeCl_3:HCl=2:1$, the etching temperature; 40° C., $In_2O_3$ pattern forming conditions, the resist used: AZ 1350 of $\simeq 0.6$ μm thick or Az 1350 J of $\simeq 3$ μm-4 μm thick both available from Shipley Far East Ltd.). In the case of a metal material which is inert to the $In_2O_3$ etchant, for example, Au is vacuum deposited on the glass substrate and patterned via the steps of FIG. 2(b), the metal Au material displays a bad adherence with the glass substrate and tends to separate from the glass substrate during the pattern formation (FIG. 2(b) D-E). As a result, the Au layer would fail to serve as an electric conductor.

Figure 3:
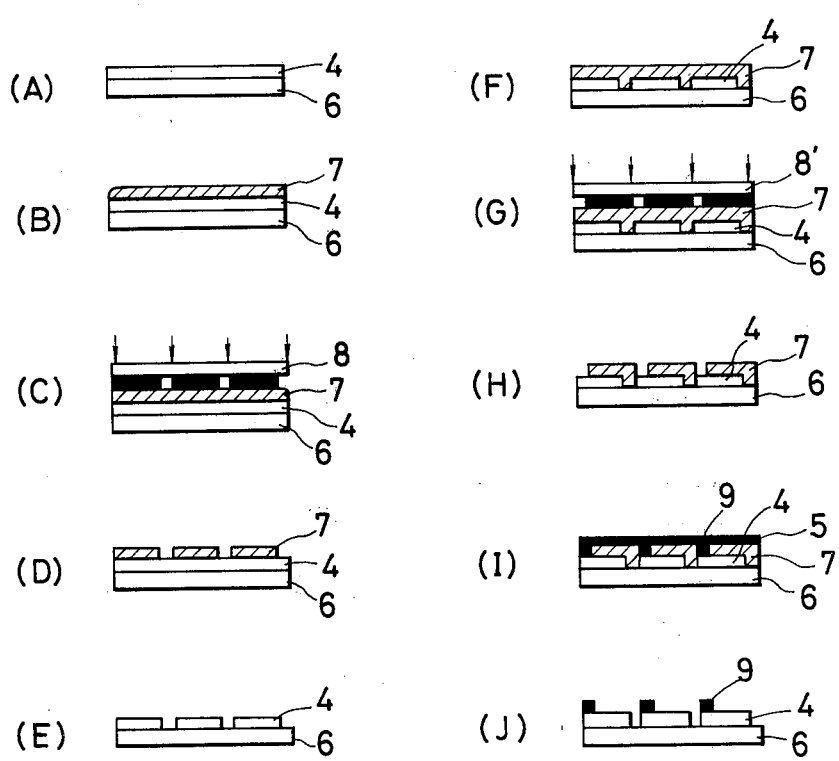
FIG. 3 is a flow chart showing the formation of an electrode pattern according to the present invention.

The present invention overcomes the problems such as erosion through the utilization of a lift off method. A method for forming an electrode pattern according to the present invention will now be described by reference to FIG. 3.

A transparent conductive layer 4 of $In_2O_3$, $SnO_2$, etc. is deposited on a glass substrate 6 (FIG. 3A) and a photosensitive resist layer 7 of the positive type is overlaid on the transparent conductive layer 4 by painting (FIG. 3B).

After light exposure through a photomask (FIG. 3C), the photoresist layer 7 is developed and patterned (FIG. 3D). While the patterned photoresist layer 7 is used as a mask, the transparent conductive layer 4 is selectively etched in a desired pattern and then removed away therefrom, forming a transparent conductive layer pattern (FIG. 3E). Subsequently, after the positive type photoresist layer 7 is substantially entirely painted (FIG. 3F), light exposure is effected through a photomask 8' distinct from the previous one (as in FIG. 3C), followed by development (FIG. 3G). The result is the formation of a photoresist pattern (FIG. 3H). In addition, a conductive metal layer 5 is deposited on the resist pattern bearing substrate (FIG. 3I) and then separated together with the aid of an organic solution such as acetone and dimethylamide, thus patterning the conductive metal layer 5 (FIG. 3J).

In the case where the conductive metal material 5 comprises aluminum (Al), it is difficult to remove Al through ultrasonic cleaning on an acetone solution during the lift off steps (FIG. 3I-J) and strong mechanical friction is necessary at the same time for the removal of Al. The resulting edges of the Al layer become indented with a bad visual appearance.

The results of the inventors' experiments indicate that nickel (Ni) gives satisfactory results as a conductive metal material. An embodiment of the present invention using Ni as a conductive metal material will be described in detail with reference to FIG. 3.

As viewed from FIG. 3A, $In_2O_3$ is vacuum deposited as the transparent conductive layer 4 on the glass substrate 6 with a substrate temperature of 350° C., a thickness of $\simeq 500$ A, a deposition rate of $\simeq 3-4$ A/sec and a vacuum degree of $4 \times 10^{-4}$ torr with $O_2$ leak.

The transparent conductive layer $In_2O_3$ 4 is coated with a photoresist layer 7 of the positive type such as AZ 1350 and AZ 1350J (naphthoquinoneamido group) with the help of a spinner (conditions, spinner: K360SW 500 type of Kyowa Kiken, resist: AZ 1350 or AZ 1350J by Shipley Far East Ltd.; spinner revolution speed: 1500 rpm/2 sec (initial) and 2500 rpm/28 sec (stable): resist thickness: 0.6 μm of AZ 1350 and 2.5 μm of AZ 1350J; soft baking: 90° C. and 30 min).

Light exposure is carried out after soft baking (FIG. 3C) with an ultrahigh voltage mercury tube USH 500C by Ushio Electric Co., an exposure time of 9 sec and 20 sec for AZ 1350 and AZ 1350J.

Subsequent to the light exposure, a resist pattern is developed and formed (FIG. 3D) with a developer AZ by Shipley Far East Ltd, distilled water 1:1, room temperature, and a period of 60 sec and 90 sec for AZ 1350 and AZ 1350J. After development the resist pattern is fully cleaned with distilled water and post-baked with 135° C. and 90 min.

After the post-baking the transparent conductive layer 4 ($In_2O_3$) is chemically etched for formation of a pattern while the resist layer 7 is used as a mask (FIG. 3E). The etching conditions are an etchant $FeCl_3:HCl=2$, 140° C. and 2 min 30 sec.

The remaining resist layer is removed with acetone or a resist remover AZ 112A by Shipley Far East Ltd and then a layer 7 of a positive type resist material AZ-1350 or AZ-1350J is disposed on the pattern surface bearing $In_2O_3$ layer (FIG. 3F) with the same conditions as in FIG. 3B.

Soft-baking (90° C., 20 min) and light exposure are carried out in sequence (FIG. 3G). After development and post-baking Ni is vacuum deposited on the resist pattern bearing surface to form a thin film of Ni conductive material (FIG. 3I) with an electron beam deposition method, a substrate temperature of room temperature, a layer thickness of ≃500 A, a vacuum degree of $5 \times 10^{-5}$ Torr and a speed of 80-80 Hz/sec.

The Ni layer is removed from the resist layer with the aid of ultrasonic cleaning within an acetone solution to form a metal electrode pattern (FIG. 3J).

It is possible that the nickel layer may be removed by an organic solvent such as dimethylamide and a photosensitive resist remover such as organic amine group alkali remover.

The metal electrodes made in the above described manner are quick to remove and the edges of the metal electrodes of nickel are sharp and the conductor Ni shows a good adhesion with the transparent conductive layer $In_2O_3$. A highly dependable electrode pattern is provided in this manner. To further enhance reliability of the surface of the conductor of Ni, a metal oxide layer may be deposited through anodic oxidization immediately before the step of FIG. 3J but after the step FIG. 3I (vacuum deposition of Ni) in the following manner. Anodic oxidization is carried out with an ammonium tertrate aqueous solution (PH=5.5) as an anodic oxidizing solvent, a DC 10 mA power source (an anodic oxidizing area of 70 cm$^2$), a period of 5 min and a voltage up to 22 V. Thereafter, cleaning is carried out with distilled water to form a pattern (FIG. 3J). The anodic oxidization step prevents corrosion of the Ni surface by moisture in the air and thus ensuring high reliability.

As noted earlier, the present invention eliminates corrosion due to reduction of the transparent conductive layer $In_2O_3$, the residuum of the metal on the $In_2O_3$ surface (as experienced with the method of FIG. 2(a)) and the occurrence of breaks and pinholes due to the $In_2O_3$ solution (as experienced with FIG. 2(b)).

Whereas the present invention has been described with respect to specific embodiments thereof, it will be understood that various changes and modifications will be suggested to one skilled in the art, and it is intended to encompass such changes and modifications as fall within the scope of the appended claims.

We claim:

1. A method for forming on a substrate a metal electrode pattern and a transparent electrode pattern both of which overlap at least in part with each other, said method comprising the steps of:
   etching a transparent, electrically conductive film deposited on a major surface of the substrate for the formation of the transparent electrode pattern;
   overlaying the whole of the major surface of the substrate with a layer of photoresist;
   removing a portion of said photoresist layer to form an area defining a metal electrode pattern;
   coating substantially the entire major surface of the substrate with a layer of metal electrode material, said metal electrode material extending into said area defining said metal electrode pattern; and
   removing the remaining photoresist layer with the aid of a resist remover thereby forming the metal electrode pattern.

2. A method according to claim 1, wherein said metal electrode material layer comprises nickel.

3. A method according to claim 1, wherein said transparent, electrically conductive film is $In_2O_3$.

4. A method according to claim 1, wherein said transparent, electrically conductive film is $SnO_2$.

5. A method for forming on a substrate a metal electrode pattern and a transparent electrode pattern both of which overlap at least in part with each other, said method comprising the following steps:
   depositing a transparent, electrically conductive layer on substantially the entire surface of a glass substrate;
   coating substantially the entire surface of said transparent, electrically conductive layer with a photoresist layer of a positive type;
   masking a first portion of said photoresist layer;
   exposing said masked photoresist layer to a source of light;
   removing a portion of said photoresist layer by utilizing a developer;
   chemically etching said transparent, electrically conductive layer to form a transparent electrode pattern, while using the remaining photoresist layer as a mask;
   removing the remaining portion of said photoresist layer;
   coating substantially the entire surface of said substrate with a layer of photoresist;
   masking a second portion of said photoresist layer;
   exposing said masked photoresist layer to a source of light;
   removing a portion of said photoresist layer by utilizing a developer to form an area defining a metal electrode pattern;
   coating substantially the entire major surface of said substrate with a layer of metal electrode material, said metal electrode material extending into said area defining said metal electrode pattern and adhering directly to said transparent, electrically conductive layer; and
   removing the remaining photoresist layer and excess metal electrode material thereby forming the metal electrode pattern.

6. A method according to claim 5, wherein said transparent, electrically conductive film is $In_2O_3$.

7. A method according to claim 5, wherein said transparent, electrically conductive film is $SnO_2$.

8. A method according to claim 5, wherein said metal electrode material is nickel.

9. A method for forming on a substrate a metal electrode pattern and a transparent electrode pattern both of which overlap at least in part with each other, said method comprising the steps of:
   etching a transparent, electrically conductive film deposited on a major surface of the substrate for the formation of the transparent electrode pattern;
   overlaying the whole of the major surface of the substrate with a layer of photoresist;
   removing a portion of said photoresist layer to form an area defining a metal electrode pattern;
   coating substantially the entire major surface of the substrate with a layer of nickel extending into said area defining said metal electrode pattern;
   bring said nickel layer into a passive state through an anodic oxidizing method; and
   removing the remaining photoresist layer with the aid of a resist remover thereby forming the metal electrode pattern.

10. A method for forming on a substrate a metal electrode pattern and a transparent electrode pattern both of which overlap at least in part with each other, said method comprising the following steps:
    depositing a transparent, electrically conductive layer on substantially the entire surface of a glass substrate;

coating substantially the entire surface of said transparent, electrically conductive layer with a photoresist layer of a positive type;

masking a first portion of said photoresist layer;

exposing said masked photoresist layer to a source of light;

removing a portion of said photoresist layer by utilizing a developer;

chemically etching said transparent, electrically conductive layer to form a transparent electrode pattern, while using the remaining photoresist layer as a mask;

removing the remaining portion of said photoresist layer;

coating substantially the entire surface of said substrate with a layer of photoresist;

masking a second portion of said photoresist layer;

exposing said masked photoresist layer to a source of light;

removing a portion of said photoresist layer by utilizing a developer to form an area defining a metal electrode pattern;

coating substantially the entire major surface of said substrate with a layer of nickel extending into said area defining said metal electrode pattern and adhering directly to said transparent, electrically conductive layer;

bring said nickel layer into a passive state through an anodic oxidizing method; and removing the remaining photoresist layer and excess metal electrode material thereby forming the metal electrode pattern.

* * * * *